United States Patent

[11] 3,622,801

[72] Inventor David W. Stone
Franklin, Wis.
[21] Appl. No. 10,846
[22] Filed Feb. 12, 1970
[45] Patented Nov. 23, 1971
[73] Assignee Harnischleger Corporation
West Milwaukee, Wis.

[54] PULSE GENERATOR HAVING ADJUSTABLE THRESHOLD LEVEL
15 Claims, 5 Drawing Figs.

[52] U.S. Cl. .......... 307/262, 307/268, 307/311, 330/69, 328/57
[51] Int. Cl. .......... H03k 1/12
[50] Field of Search .......... 328/57, 59; 307/262, 268, 260, 247, 311; 330/300, 69

[56] References Cited

UNITED STATES PATENTS

| | | | |
|---|---|---|---|
| 2,905,835 | 9/1959 | Wray | 307/268 |
| 3,050,675 | 8/1962 | Williams | 307/211 |
| 3,421,093 | 1/1969 | Hinrichs | 328/57 |
| 3,476,941 | 11/1969 | Donin | 307/268 |

OTHER REFERENCES

Droege, F. J., Complementary Pulse Generators, 8- 58, Vol. 1, No. 2 IBM Tech. Disclosure Bulletin, p. 27 328- 57

*Primary Examiner*—Donald D. Forrer
*Assistant Examiner*—David M. Carter
*Attorney*—James E. Nilles

ABSTRACT: A pulse generator generates a pair of complementary pulse train output signals. The pulse generator includes input circuitry which provides the single pulse train signal and a bias signal. These signals are provided to an operational amplifier, the output signal of which alternately energizes a pair of current control devices. The magnitude of the bias signal is adjustable to alter the threshold level of the pulse generator.

INVENTOR:
DAVID W. STONE

BY: James E. Nilles
ATTORNEY

PULSE GENERATOR HAVING ADJUSTABLE THRESHOLD LEVEL

BACKGROUND OF THE INVENTION

1. Field of the Invention

The present invention is directed to pulse-generating circuits of the type providing a plurality of pulse train output signals.

2. Description of the Prior Art

Many types of electrical apparatus incorporate or utilize pulse generators providing a plurality of pulse train output signals. For example, a pulse generator may be required which provides two complementary output signals, one of which is inverted with respect to the other. Thus, when a pulse appears in one of the output signals, a pulse does not appear in the other of the output signals. The output signals are provided upon the application of an input to the pulse generator. A threshold level is established in the pulse generator which causes the output signals to be generated when the input reaches a desired magnitude.

While pulse generators of the type described above are know, they suffer numerous shortcomings, In general, these shortcomings involve various instabilities which occur in such pulse generators including instability or drift in the timing and width of the pulses, alteration in the magnitude or height of the pulses, and operational changes due to variations in temperature. The inability to readily and stably adjust the timing and width of the pulses by adjusting the threshold level has also been a problem.

SUMMARY OF THE PRESENT INVENTION

It is, therefore, the object of the present invention to provide an improved pulse generator which provides a pair of complementary output signals. The pulse generator of the present invention is fully compensated for changes in ambient temperature. The pulse generator of the present invention provides output pulses of desired constant width and timing in the face of changes in operative conditions such as variations in line voltage or in the pulse generator input while at the same time permitting the width and timing of the output pulses to easily be changed by adjusting the threshold level. The pulse generator of the present invention includes means for preventing the height of the output pulses from varying beyond predetermined limits.

The pulse generator of the present invention features constant current operation for lending additional stability thereto and for lessening the electrical interaction with other closely coupled devices.

The pulse generator of the present invention includes input circuitry having signal means for providing a single pulse train input signal. The input circuitry also includes bias means for providing first and second bias signals. An operational amplifier has its inputs connected to the signal means and bias means for receiving the pulse train input signal and the first bias signal. The pulse generator has output circuitry including first and second current control devices, each having input, output and control terminals. The input terminals of the devices are commoned and connected through a resistance to one side of a power supply while the output terminals are connected through load resistors to the other side of said power supply and provide the complementary pulse train signals. The operational amplifier output is connected to the control terminal of the first current control device and to the input terminal of the second current control device while the control terminal of the second current control device is connected to the bias means for receiving the second bias signal.

In operation, the generation of a pulse train signal by the input circuitry to said operational amplifier provides output signals therefrom which alternately place the first and second current control devices in the operative state to provide the pair of complementary pulse train signals.

DESCRIPTION OF THE PREFERRED EMBODIMENT

Figure 1:
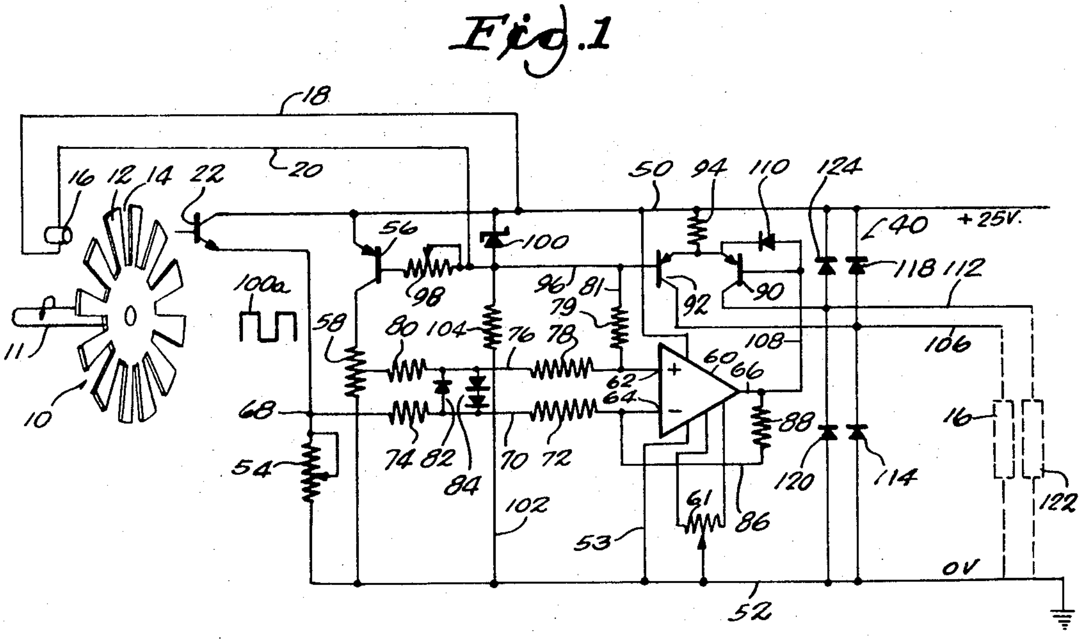
FIG. 1 is a schematic diagram of the pulse generator of the present invention.

Turning now to FIG. 1, there is shown therein the pulse generator of the present invention, identified by the numeral 40. Pulse generator 40 is shown in a typical application in which it is employed to provide a plurality of pulse train output signals, the rate or frequency of which are proportional to the rotary speed of a shaft.

Pulse generator 40 is energized by power busses 50 and 52 connected to the incoming power lines for the pulse generator. Specifically, power bus 50 may be considered to be at positive 25 volts potential while power bus 52 is at zero volts potential. Zener diode 100 is connected between power bus 50 and conductor 96 for establishing a voltage on conductor 96 dependent on the breakover voltage of the diode. This voltage may, for example, be approximately 4.7 volts negative with respect to bus 50, and remains at that level regardless of variations in the voltage impressed across power busses 50 and 52 due to the operating characteristics of the Zener diode. Conductor 102 containing resistor 104 provides a path for the current through Zener diode 100 necessary to establish the voltage level in conductor 96.

Input Circuitry

To measure the rotary speed of shaft 11, disc 10 is mounted thereon. Disc 10 has a plurality of spokes 12 extending from the periphery thereof. Spokes 12 are sized so that the spokes and the spaces 14 between them are equal in size. A light source 16 is mounted behind disc 10 so that spokes 12 pass in front of the light in a sequential manner. Light source 16 is connected between power bus 50 and conductor 96 by conductors 18 and 20 so that the light source is energized by the constant voltage between bus 50 and conductor 96. This insures that the light output of light source 16 will remain constant despite variations in the line voltage in busses 50 and 52. As the light output or brightness changes by the fourth power with variations in the applied voltage (see Catalog No. CML–1, Chicago Miniature Lamp Works, Chicago, Ill.) variations in line voltage can be very detrimental to the stable operation of pulse generator 40, as hereinafter described.

Transistor 22 is aligned with light source 16, but placed on the other side of disc 10 so that the spokes 12 pass between the light source and the transistor. Transistor 22 is of a type having a light sensitive base terminal so that when light from the light source strikes the base terminal, the transistor is rendered conductive. A typical transistor having a light sensitive base which may be utilized as transistor 22 of pulse generator 40 is the NPN planar silicon phototransistor manufactured and sold by Texas Instruments Co., Inc., Dallas, Tex., under the model designation TIL 611.

The emitter-collector circuit of transistor 22 is connected across power busses 50 and 52 in series with resistor 54. The magnitude of resistor 54 is adjustable for a purpose hereinafter described. The emitter-collector circuit of transistor 22 is paralleled by the emitter-collector circuit of a second transistor 56 which is connected across power busses 50 and 52 and in series with potentiometer 58. The base of transistor 56 is connected to conductor 96 through resistor 98, the resistance of which may be adjustable in magnitude.

Operational Amplifier

Pulse generator 40 includes an operational amplifier 60 connected across power busses 50 and 52 by conductors 51 and 53 and energized thereby. Operational amplifier 60 has a pair of input terminals 62 and 64 and a single output terminal 66. Operational amplifier 60 may be of the differential input signal type in that it is operable by the signal difference between the signals applied to the two input terminals. Input terminal 62 is termed the noninverting or positive input terminal in that a signal of a given sign with respect to terminal 64 applied to terminal 62 provides an output signal at output terminal 66 of the same sign. Input terminal 64 is termed the inverting or negative input terminal as an input signal of a given sign with respect to terminal 62 applied to terminal 64 is inverted in sign at output terminal 66. Operational amplifier 60 may comprise that identified by the model designation 741C and sold by the Fairchild Semiconductor Corp. of Mountainview, Calif.

An intermediate terminal 68 between the emitter of transistor 22 and resistor 54 is connected to the inverted input terminal 64 of operational amplifier 60 by means of conductor 70 containing input resistors 72 and 74. The wiper of potentiometer 58 is connected to the noninverting input terminal 62 of operational amplifier 60 by means of conductor 76 containing input resistors 78 and 80. Two sets of series connected breakover diodes 82 and 84 are connected in parallel between conductors 70 and 76 for shorting the two inputs together when the signals in conductors 70 and 76 exceed the breakover voltage of the diodes, thereby limiting the input signals to operational amplifier 60 to the breakover voltage of the diodes. For example, one diode may be provided in set 82 while two diodes are provided in set 84.

Output terminal 66 and inverting input terminal 64 are connected together by feedback conductor 86 containing feedback resistor 88. An additional feedback resistor 79 is located in conductor 81 connected between conductor 96 and input terminal 62. The relative magnitudes of feedback resistors 88 and 79 and input resistors 72 and 78 determine the gain of operational amplifier 60 in the well known manner of these amplifiers. In pulse generator 40 of the present invention, resistors 72, 78, 79 and 88 are equal in magnitude so that operational amplifier 60 has a gain of one or unity gain. The output of operational amplifier 60 at output terminal 66 may be altered independently of any input signals to the amplifier by means of potentiometer 61.

Output Circuitry

The output circuitry of pulse generator 40 includes a pair of transistors 90 and 92 having their emitter terminals commoned and connected through a resistor 94 to power bus 50. The emitter of transistor 92 is also connected to the output of operational amplifier 60 in conductor 108 through diode 110. The base terminal of transistor 92 is connected to conductor 96. The collector of transistor 92 is connected to conductor 106 containing one output signal of pulse generator 40.

The base of transistor 90 is connected to output terminal 66 of operational amplifier 60 by conductor 108. The collector of transistor 90 is connected to conductor 112 containing the other output of pulse generator 40.

Conductor 106 is connected to power bus 52 by diode 114 and to power bus 50 by diode 118. Conductor 112 is connected to power bus 52 by diode 120 and to power bus 50 by diode 124. The loads 116 and 122 for the output signals in conductors 106 and 112 are connected between the output signal conductors and bus 52. Diodes 114, 118, 120, and 124 serve to limit the magnitude of any electrical noise which may be transmitted to pulse generator 40 by conductors 106 and 112 and loads 116 and 122, and to protect pulse generator 40 against the accidental application of reversed polarity voltage to power busses 50 and 52.

Prior to operating pulse generator 40, it is necessary to conduct certain adjustment procedures to establish and insure the stability of the operation of pulse generator 40. The pulse generator is energized by applying a positive voltage to power bus 50. Typically, this voltage is +25 volts. Zener diode 100 provides the voltage on conductor 96 and on the base of transistor 92 which remains constant, regardless of the current flow through the diode and conductor. The voltage on conductor 96 may be clamped at 4.7 volts negative with respect to bus 50.

It is necessary to initially adjust the input circuitry of pulse generator 40. Disc 10 is moved so that the light from light source 16 strikes the base of transistor 22 with full intensity. The magnitude of resistor 54 is adjusted so that a signal of the desired magnitude appears at the emitter of transistor 22 and at terminal 68 with conductor 70 open. The magnitude of resistor 98 is then adjusted so that the voltage at the collector of transistor 56 is the same as the voltage at the emitter of transistor 22 under conditions in which the base of transistor 22 is fully exposed to light source 16. The voltage in both cases may be about 10 volts.

It will be appreciated that when disc 10 and shaft 11 are turning rapidly, the voltage at intermediate terminal 68 will vary almost instantaneously from zero volts, as when a spoke 12 is between transistor 22 and light source 16, to 10 volts as when light from source 16 strikes the base of transistor 22. However, when disc 10 and shaft 11 are turning slowly, a finite time is required for the voltage at intermediate terminal 68 to change from a level of zero volts to a level of 10 volts and back to the level of zero volts when a spoke is again reinserted between light source 16 and transistor 22. This is shown in the figures by the graph 130 and time interval $T_1—T_2$ in FIG. 2C.

Figures 2A, 2B:
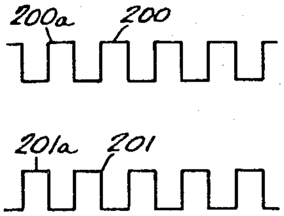
FIG. 2A through 2D are wave forms showing the operation of the pulse generator of the present invention.

It is therefore necessary to select a voltage level between zero and 10 volts at which operational amplifier 60 will be affected: that is, a time between time $T_1$ and $T_2$ at which the generation of a pulse will occur. This voltage level is termed the threshold level and the time is usually arbitrarily selected as time $T_3$ half-way between $T_1$ and time $T_2$. This selection is made by adjusting the wiper of potentiometer 58 so that a voltage of approximately 5 volts is generated in conductor 76. It will be appreciated that a voltage of 5 volts is half-way between the zero and 10 volt voltage levels of intermediate terminal 68. When the voltage at intermediate terminal 68 returns to zero volts a time interval similar to $T_1—T_2$ occurs and the operation of operational amplifier is affected at time $T_4$. As hereinafter described, the result of the above described operation is the generation of the pulse shown in FIG. 2D.

Figure 2C:
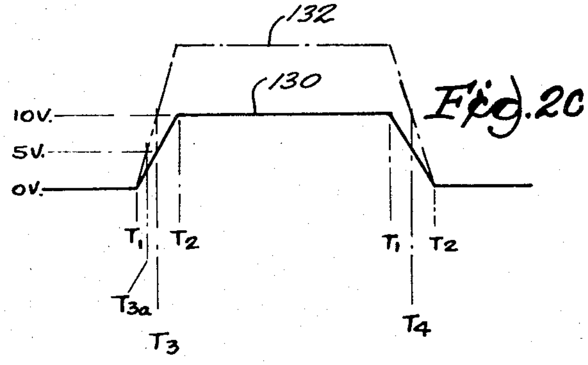
Figure 2D:
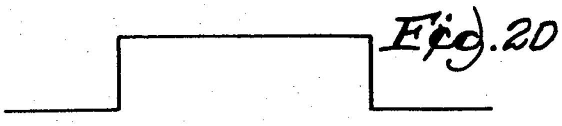

The effect of variations in the light output of light source 16 on the operation of pulse generator 40 may also be seen by reference to FIG. 2C. If the intensity of the light source were to increase, the voltage at intermediate terminal 68 would also increase, as shown by the graph 132. This could occur if light source 16 were connected to a power source, the voltage of which varies rather than being connected to the constant voltage across power bus 50 and conductor 96. The increased voltage at intermediate terminal 68 attains a magnitude of 5 volts at time $T_3a$. Time $T_3$ a occurs earlier in the time interval $T_1—T_2$ than does time $T_3$ and causes the initiation of the pulse shown in FIG. 2D to be shifted to the left, as shown in FIG. 2C. In the pulse generator of the present invention, the voltage applied to light source 16 is fixed by Zener diode 100 so that this shift cannot occur.

The input signals to operational amplifier 60 are limited by diode sets 82 and 84 extending between conductors 70 and 76. These diodes limit the maximum voltage that can exist between conductors 70 and 76 to the breakover voltage of the diodes. To provide proper operation of pulse generator 40 in the present exemplary instance, it is necessary that conductor 76 assume a positive potential of approximately one volt with respect to conductor 70 and that conductor 70 assume a positive potential of approximately 0.5 volt with respect to conductor 76.

It is also necessary to adjust the operation of pulse generator 40 so that with no difficult input signal to operational amplifier 60 there will be equal signals in conductors 106 and 112. To do this, the connection between the wiper of potentiometer 58 and resistor 80 is opened and diode sets 80 and 82 shorted together so that similar input signals are supplied to both of input terminals 62 and 64. Under such conditions, the output signal of operational amplifier 60 in conductor 108 applied to the base terminal of transistor 90 is adjusted so that it is approximately equal to the 4.7 volts negative relative to bus 50 applied to the base terminal of transistor 92 in Zener diode 100, thereby placing the transistors in a state of balance in which both are in an equally conductive state. This is accomplished by potentiometer 61 which may be used to adjust the output of operational amplifier independently of any input signals thereto and by measuring the equality of the currents through loads 116 and 122 of conductors 106 and 112, respectively. The connection between the wiper of potentiometer 58 and resistor 80 is then restored.

The operation of pulse generator 40 may be analyzed by considering initially an operative condition in which a space 14 of disc 10 is between light source 16 and transistor 22 so that light strikes the base terminal of transistor 22. Under such conditions, transistor 22 will be in the conductive state, causing a current 100*a* to flow in the base-emitter circuit and through intermediate terminal 68 and resistor 54. As noted, supra, this current generates a voltage of approximately 10 volts at intermediate terminal 68. However, the input signal to operational amplifier 60 in conductor 70 is limited to approximately +0.5 volts by means of breakover diode 82. The signal in conductor 70 is provided to the inverting input 64 of operational amplifier 60 so that the reduction in voltage of the 4.7 volt (negative relative to bus 50) output signal at output terminal 66 results from the +0.5 volt signal in conductor 70. A voltage reduction of 0.5 volts will result because of the 1:1 gain of operational amplifier 60.

The output signal of operational amplifier 60 is provided in conductor 108 to the base of transistor 90 to turn on that transistor. The reduced voltage applied to the base terminal of transistor 90 alters the emitter voltage through emitter follower action, increasing the voltage drop across resistor 94, and providing emitter-collector current of 40 milliamperes and the very small emitter-base current necessary to place transistor 90 in the conductive state. The 40 milliampere current appears at the collector of transistor 90 as pulse 200A in conductor 112. See FIG. 2A.

The altered voltage of the emitter of transistor 90 biases the emitter of transistor 92 such that transistor 92 is rendered nonconductive preventing a signal from appearing in conductor 106. See FIG. 2B.

As spoke 12 becomes located between light source 16 and transistor 22, transistor 22 will be rendered nonconductive, placing the potential of intermediate terminal 68 at zero volts. This will remove the 0.5 volt signal applied to the inverting input terminal 64 of operational amplifier 60, restoring the output signal of operational amplifier 60 to 4.7 volts negative with respect to bus 50 and returning transistors 90 and 92 to the equally conductive state.

Subsequently, the 5 volt voltage on the wiper of potentiometer 58 will apply a signal to operational amplifier 60. Due to diodes 84, this signal will be one volt and will be supplied to the noninverting input terminal 62 of operational amplifier 60 so that the voltage of the output signal of operational amplifier 60 in conductor 108 will also be increased by one volt. Thus the total signal change to operational amplifier 60 as disc 10 rotates and positions a spoke 12 between light source 16 and transistor 22 is 1.5 volts.

The first 0.5 volt increase in the output signal of operational amplifier 60 in conductor 108 above 4.7 volt negative level with respect to bus 50 when applied to the base terminal of transistor 90 commences the turn off of that transistor and the turn on of transistor 92. The turn on of transistor 92 provides an emitter-collector current of approximately 30 milliamperes by means of the emitter current provided by resistor 94. The emitter current is less for transistor 92 than for transistor 90 because there is no emitter follow action present in the former transistor and the voltage across resistor 94 is less.

The second 0.5 volt signal increase in conductor 108 is of a magnitude and polarity to initiate the breakover of diode 110 and provide a current of approximately 10 milliamperes to the emitter of transistor 92. The emitter current provided through diode 110, plus the current through resistor 94 is sufficient to provide the appropriate base current, as well as 40 milliamp current at the collector of transistor 92 which forms output pulse 201A in conductor 106. The saturation characteristics of operational amplifier 60 insures that excessive current will not be drawn through diode 110 and transistor 92.

The above described operation of pulse generator 40 continues as disc 10 rotates. Each time a space 14 in disc 10 appears between light source 16 and transistor 22, a signal 200 appears in conductor 112 but no signal appears in conductor 106. Each time a spoke passes between light source 16 and transistor 22, a signal 201 appears in conductor 106 but not in conductor 112. The two pulse train signals 200 and 201 shown in FIGS. 2A and 2B are thus formed.

The magnitudes of current pulse train output signals 200 and 201 are automatically limited by the output circuitry of pulse generator 40. If the current through the emitter-collector circuit of either transistors 90 or 92 attempts to increase, the current through resistor 94 also increases. This increases the voltage drop across resistor 94 and decreases the emitter voltage of the transistors. The reduced emitter voltage lessens the conductivity of the transistors and the current signals 200 and 201.

As the ambient temperature changes, the output of transistor 22 changes, altering the voltage at intermediate terminal 68. Normally, this would alter the operation of pulse generator 40 responsive to ambient temperature changes. However, it has been found that the operation of transistor 58 changes in a similar manner over the same temperature range so that the input signals to operational amplifier 60 remain relatively the same, i.e. with respect to one another. Thus, the operation of pulse generator 40 is not, in fact, altered as the ambient temperature changes.

I claim:

1. A pulse generator for deriving complementary output pulses comprising in combination,
   a differential input operational amplifier having inverting and noninverting inputs and a DC reference voltage applied to one input thereof,
   means for generating a train of unidirectional input pulses, said input pulse generating means being coupled to the other input of said operational amplifier and each said input pulse varying between a lower potential which is less than said reference voltage and a higher potential which is greater than said reference voltage,
   first and second transistors having their emitters commoned and connected through a resistance to one side of a DC power source and having their collectors connected through load resistors to the other side of said power source, the base of said first transistor being coupled to a constant DC potential and the base of said second transistor being connected to the output of said operational amplifier, said operational amplifier being adjusted so that its output voltage is approximately equal to said constant DC potential when equal signals are applied to its input terminals, whereby said first and second transistors conduct alternately and complementary pulses are generated across said load resistors.

2. A pulse generator in accordance with claim 1 and including means for adjusting said DC reference voltage applied to said one input of said operational amplifier.

3. A pulse generator in accordance with claim 1 and including a diode connected between the base and emitter of said second transistor which conducts when said second transistor is turned off and supplies current to the emitter-collector junction of said first transistor.

4. A pulse generator in accordance with claim 1 wherein said operational amplifier is of the differential input, saturable type and has an amplification factor of approximate unity.

5. A pulse generator in accordance with claim 1 wherein said input pulse generating means includes an electric lamp,
   a constant voltage source for said lamp,
   a phototransistor, and light chopper means between said lamp and said phototransistor for alternately blocking and passing light from said lamp to said phototransistor.

6. A pulse generator in accordance with claim 5 and including transistor means for applying said DC reference voltage to said one input of said operational amplifier and having a temperature response characteristic similar to the temperature response characteristic of said phototransistor.

7. A pulse generator in accordance with claim 1 and including means for limiting the magnitude of the input signals to said inverting and noninverting inputs with respect to each other.

8. A complementary pulse generator comprising, in combination, means for generating a train of unidirectional input pulses which vary between a lower and a higher potential, a direct current power supply, a differential input saturable operational amplifier having inverting and noninverting inputs and one input coupled to said input pulse deriving means and the other input coupled to a DC reference voltage which is intermediate said higher and lower potentials, whereby the output from said operational amplifier varies between a relatively high and a relatively low voltage, first and second controllable semiconductor devices each having input, control, and output electrodes, said control electrodes of said first and second semiconductor devices being commoned and connected through a resistance to one side of said power supply and the output electrodes thereof being connected through individual load resistors to the other side of said power supply, the input electrode of said first semiconductor device being connected to the output of said operational amplifier, and means for applying a constant DC voltage to the input electrode of said second semiconductor device.

9. A complementary pulse generator in accordance with claim 8 wherein said constant DC voltage forward biases said second controllable semiconductor device and is approximately equal to the output voltage from said operational amplifier when equal signals are applied to the inputs of said operational amplifier so that said first and second semiconductor devices conduct approximately equal currents when no input signals are applied to said operational amplifier.

10. A pulse generator in accordance with claim 8 wherein said means for generating input pulses includes a phototransistor connected in series with a resistor across said power supply, an electric lamp, means for energizing said lamp with a constant voltage derived from said power supply, and means for intermittently blocking the light from said lamp falling upon said phototransistor.

11. A pulse generator in accordance with claim 10 wherein the junction between said phototransistor and said resistor is coupled to the inverting input of said operational amplifier and including a second transistor having its emitter-collector junction connected in series with a potentiometer across said power supply and a constant forward bias derived from said power supply applied to its base-emitter junction, the slider of said potentiometer being coupled to the noninverting input of said operational amplifier and being adjusted so that the voltage on said slider is between the potentials which appear at said junction between said phototransistor and said resistor when the light from said lamp is received by, and when it is blocked from, said phototransistor.

12. A pulse generator in accordance with claim 11 wherein the temperature response of said phototransistor is similar to that of said second transistor so that the response of said pulse generator does not vary with temperature changes.

13. A pulse generator in accordance with claim 8 wherein said first and second semiconductor devices are similar transistors having their emitters commoned and connected through said resistance to one side of said power supply and their collectors connected through said load resistors to the other side of said power supply.

14. A pulse generator in accordance with claim 13 and including a diode connected between the base and emitter of said first semiconductor device poled to conduct and supply current to the emitter of said second semiconductor device when said first semiconductor device is turned off by the output of said operational amplifier.

15. A complementary pulse generator in accordance with claim 8 wherein the gain of said operational amplifier is approximately unity, and including means for limiting the magnitude of the input signals to said inverting and noninverting inputs with respect to each other.

* * * * *